United States Patent
Kawano et al.

(10) Patent No.: US 8,187,913 B2
(45) Date of Patent: May 29, 2012

(54) PROCESS FOR PRODUCING PHOTOELECTRIC CONVERSION DEVICES

(75) Inventors: Tetsuo Kawano, Ashigarakami-gun (JP); Takashi Koike, Ashigarakumi-gun (JP); Ryouko Agui, Ashigarakumi-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/017,879

(22) Filed: Jan. 31, 2011

(65) Prior Publication Data

US 2011/0189814 A1 Aug. 4, 2011

(30) Foreign Application Priority Data

Jan. 29, 2010 (JP) ................................ 2010-019052

(51) Int. Cl.
- *H01L 21/00* (2006.01)
- *H01L 21/76* (2006.01)

(52) U.S. Cl. ............... 438/94; 438/62; 438/93; 438/95; 438/98; 257/443; 257/463; 257/E31.032; 136/244; 136/256

(58) Field of Classification Search ............ 438/62, 438/73, 93–94, 98, 609; 257/443, 463; 136/244, 136/256–263
See application file for complete search history.

(56) References Cited

U.S. PATENT DOCUMENTS 8,048,710 B2 * 11/2011 Hashimoto ............... 438/69

FOREIGN PATENT DOCUMENTS

| JP | 06-121035 A | 4/1994 |
|---|---|---|
| JP | 2000-008180 A | 1/2000 |
| JP | 4081625 B2 | 1/2000 |
| JP | 2002-020884 A | 1/2002 |
| JP | 3445293 B2 | 9/2003 |

OTHER PUBLICATIONS

Ishizuka, Shogo, et al., "Efficiency Enhancement of Cu(In,Ga)Se$_2$ Solar Cells Fabricated on Flexible Polymide Substrates using Alkali-Silicate Glass Thin Layers," Applied Physics Express, Sep. 23, 2008, pp. 1-3, vol. 1.

Katayama, J., "Application of ZnO Prepared with Soft Solution Processing and Cu$_2$O Semiconductor Thin Film of Optoelectronics," Ritsumeikan University Doctoral Thesis, 2004.

(Continued)

*Primary Examiner* — Dung A. Le
(74) *Attorney, Agent, or Firm* — Sughrue Mion, PLLC

(57) ABSTRACT

In a process for producing a photoelectric conversion device comprising a bottom electrode layer, a photoelectric conversion semiconductor layer, a buffer layer, and a transparent conductive layer, which are stacked in this order on a substrate, all film forming stages ranging from a stage of forming the buffer layer to a stage of forming the transparent conductive layer are performed with a liquid phase technique. The buffer layer is formed with a chemical bath deposition technique, and the transparent conductive layer is formed with an electrolytic deposition technique.

17 Claims, 5 Drawing Sheets

OTHER PUBLICATIONS

Ishizaki, H., "Influence of $(CH_3)_2NHBH_3$ Concentration on Electrical Properties of Electrochemically Grown ZnO Films," Journal of the Electrochemical Society, 2001, pp. C540-C543, vol. 148, Issue 8.

Yamabi, S., et al. "Growth Conditions for Wurtzite Zinc Oxide Films in Aqueous Solutions," Journal of Materials Chemistry, 2002, pp. 3773-3778, vol. 12.

Hodes, Gary, "Semiconductor and Ceramic Nanoparticle Films Deposited by Chemical Bath Deposition," Physical Chemistry Chemical Physics, 2007, pp. 2181-2196, vol. 9.

Dona, J.M., et al., "Process and Film Characterization of Chemical-Bath-Deposited ZnS Thin Films," J. Electrochem. Soc., 1994, pp. 205-209, vol. 141, No. 1.

Gode, F., et al., "Investigations on the Physical Properties of the Polycrystalline ZnS Thin Films Deposited by the Chemical Bath Deposition Method," Journal of Crystal Growth, 2007, pp. 136-141, vol. 299.

* cited by examiner

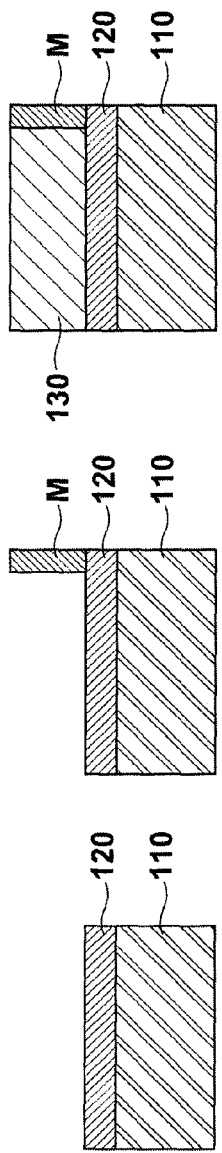
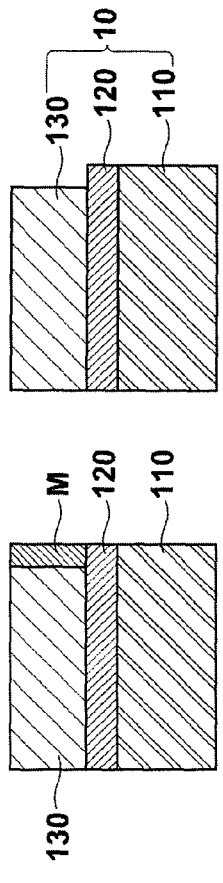
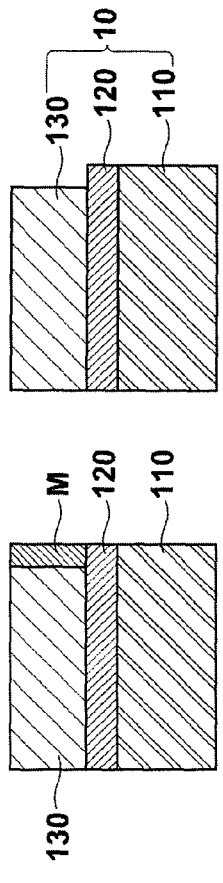
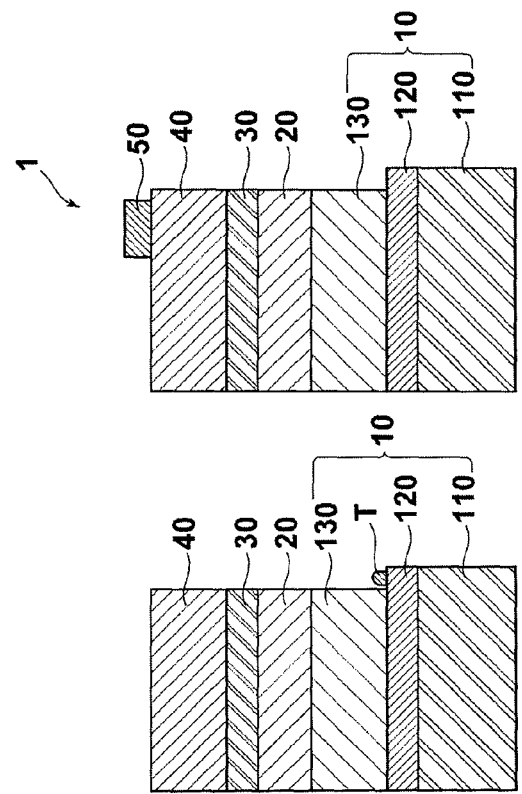
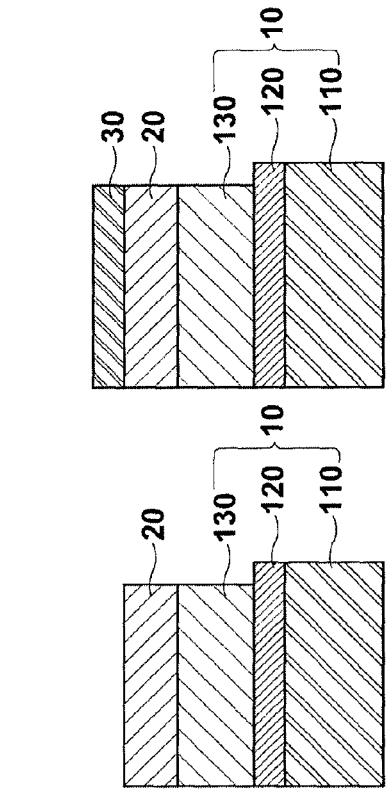
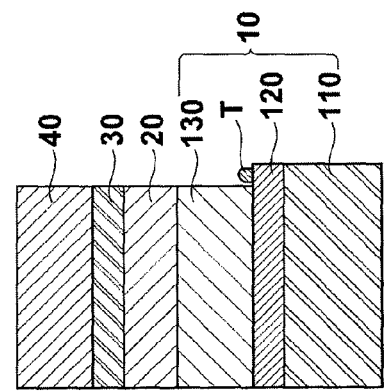
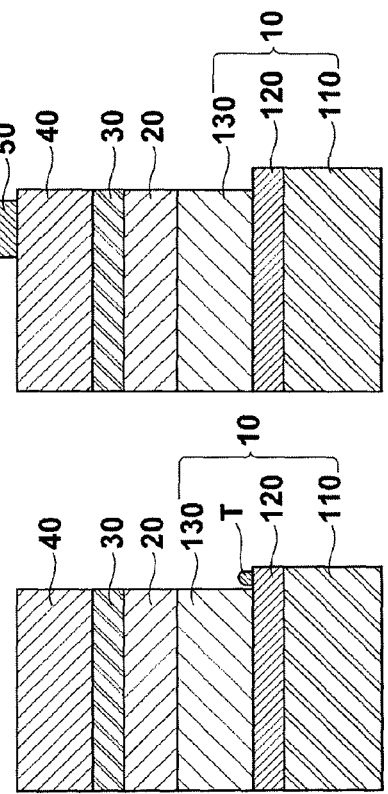
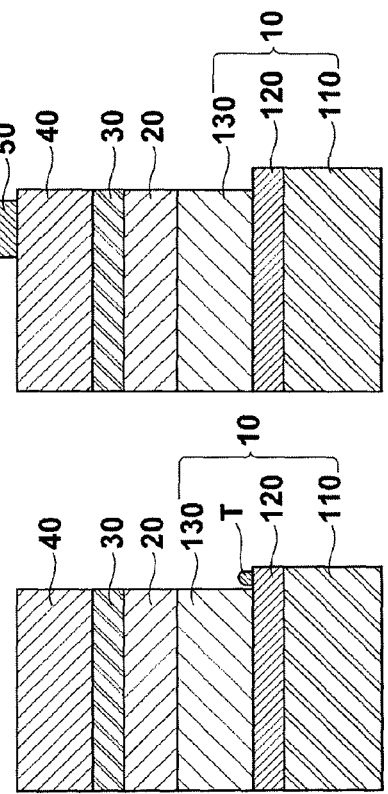

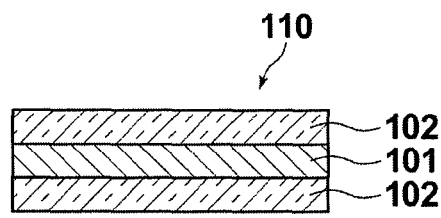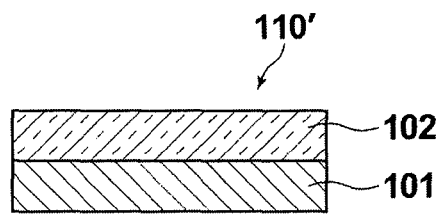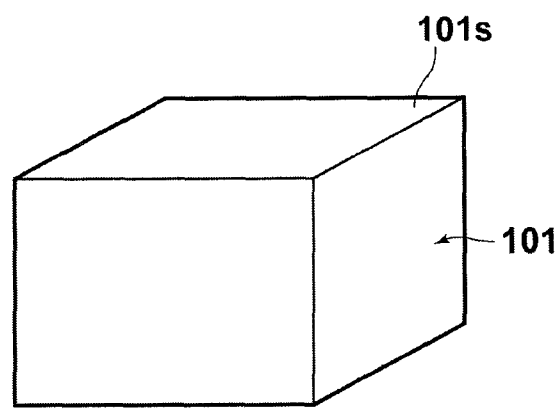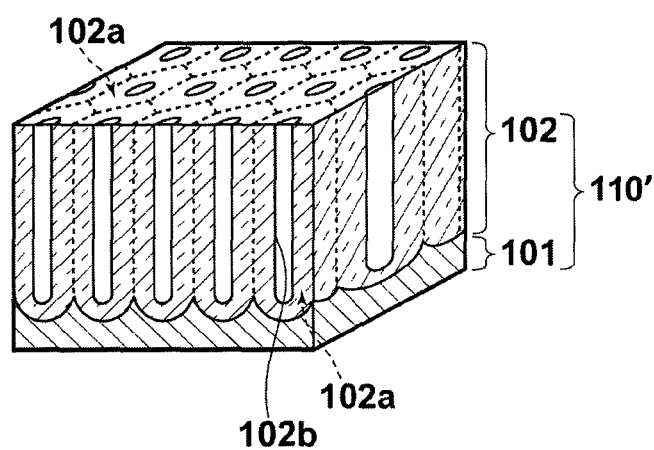

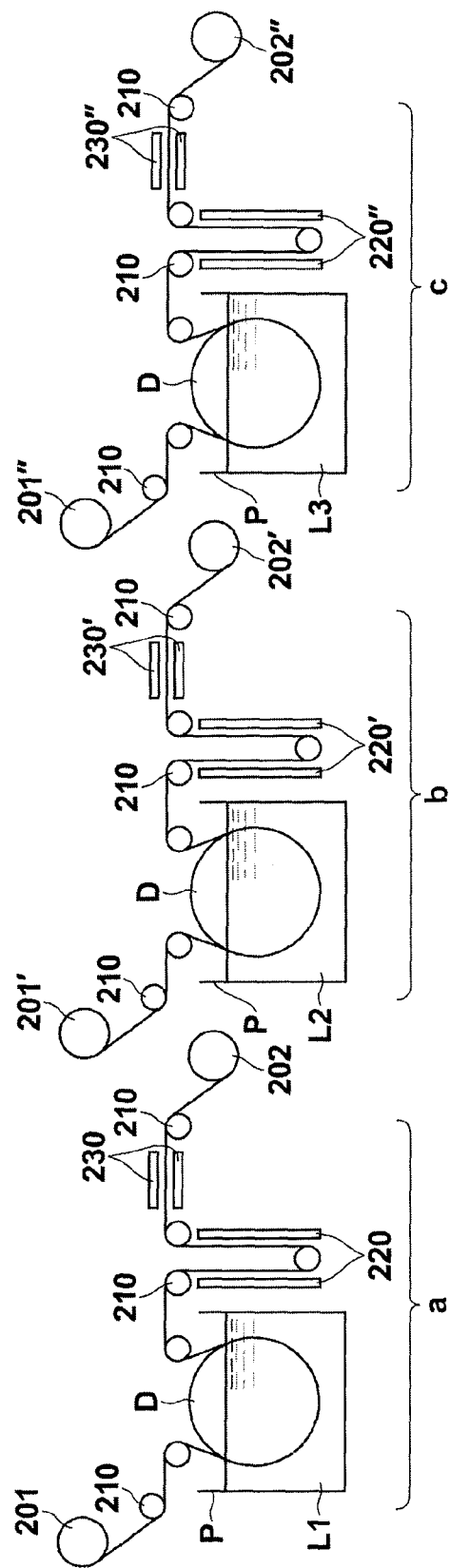

PROCESS FOR PRODUCING PHOTOELECTRIC CONVERSION DEVICES

BACKGROUND OF THE INVENTION

1. Field of the Invention

This invention relates to a process for producing a photoelectric conversion device, such as a solar cell.

2. Description of the Related Art

Photoelectric conversion devices comprising a photoelectric conversion layer and electrodes electrically connected to the photoelectric conversion layer have heretofore been used in use applications, such as solar cells. Heretofore, as the solar cells, Si type solar cells utilizing bulk single crystalline Si or polycrystalline Si, or thin film amorphous Si have been most popular. Recently, research and development have been conducted on compound semiconductor type solar cells that do not depend upon Si. As the compound semiconductor type solar cells, there have been known bulk types, such as GaAs types, and thin film types, such as CIS or CIGS types which are constituted of a Group-Ib element, a Group-IIIb element, and a Group-VIb element. The CI (G) S types are the compound semiconductors that are represented by the general formula of $Cu_{1-z}In_{1-x}Ga_xSe_{2-y}S_y$, wherein $0 \leq x \leq 1$, $0 \leq y \leq 2$, and $0 \leq z \leq 1$. In cases where x=0, the compound semiconductors are of the CIGS types. In cases where x>0, the compound semiconductors are of the CIS types. In this specification, both the CIS types and the CIGS types are often referred to as the CI (G) S types.

In the cases of the thin film types of the photoelectric conversion devices, such as the CI (G)S types, ordinarily, a transparent conductive layer (a transparent electrode) is formed on a photoelectric conversion layer with a buffer layer or a combination of the buffer layer and a window layer intervening therebetween. In the cases of the types described above, ordinarily, the buffer layer is formed by use of a chemical bath deposition technique (CBD technique).

Roles of the buffer layer are considered to be (1) prevention of recombination of photogenerated carriers, (2) matching of band discontinuity, (3) lattice matching, and (4) coverage of surface unevenness of the photoelectric conversion layer. In the cases of the CI (G) S types, and the like, ordinarily, the surface unevenness of the photoelectric conversion layer is comparatively large. Therefore, particularly, in order for the condition of (4) described above to be fulfilled satisfactorily, the CBD technique, which is a liquid phase technique, is considered to be preferable.

In cases where the buffer layer is formed with the liquid phase technique, and the film formation of the transparent conductive layer, the window layer, and the like, which are formed at stages after the formation of the buffer layer, is performed by use of vacuum processing, such as a sputtering technique, it is not possible to perform continuous film formation, such as roll-to-roll mode film formation, and therefore complicated processing is required. (Reference may be made to S. Ishizuka et al., "Efficiency Enhancement of Cu (In,Ga)Se$_2$ Solar Cells Fabricated on Flexible Polyimide Substrates using Alkali-Silicate Glass Thin Layers", Applied Physics Express, Vol. 1, 092303, pp. 092303-1-092303-3, 2008.) Also, in cases where the vacuum processing is performed after the liquid phase technique, particular surface treatment processing for the surface of a film having been formed often becomes necessary. Therefore, in order for the film formation processing to be simplified and in order for low-cost production to be achieved, it is preferable that the film formation at the stages after the formation of the buffer layer is performed entirely by use of the liquid phase technique.

As described above, as the film forming stage after the film formation of the buffer layer has been performed, the film forming stage for the transparent conductive layer is performed. In some cases, the film forming stage for the window layer is also performed. As the transparent conductive layer, a zinc oxide type of a transparent conductive layer has attracted particular attention for abundance of resources and a lower cost than ITO, which is popular currently. However, it is not always possible to form, with the liquid phase technique, the zinc oxide type of the transparent conductive layer which has good quality and which has a low electrical resistance value. The zinc oxide type of the transparent conductive layer is the electrically conductive zinc oxide thin film obtained with processing, wherein zinc oxide is doped with a dopant element having a higher valence number of ion than zinc and is thereby imparted with the electrically conductive characteristics. Therefore, for the formation of the electrically conductive zinc oxide thin film, it is preferable to use an electrolytic deposition technique (electrodeposition technique), which enables the doping of the dopant element in a high concentration. However, in the cases of the electrodeposition technique, it is necessary for an underlayer, on which the electrically conductive zinc oxide thin film is to be formed, to function as an electrode. Accordingly, in the cases of the photoelectric conversion device, wherein the underlayer is the non-conductive layer, such as the buffer layer or the window layer, it is not always possible to form the electrically conductive zinc oxide thin film that appropriately covers the underlayer and that has a low resistance.

Studies have been made on methods of forming an electrically conductive zinc oxide thin film that appropriately covers the underlayer and that has a low resistance. Each of Japanese Unexamined Patent Publication No. 2002-020884 and Japanese Patent No. 3445293 discloses a method of forming an electrically conductive zinc oxide film, wherein an initial layer of an electrically conductive zinc oxide layer is formed with sputtering film formation, and wherein an electrodeposition technique is thereafter performed. However, with the disclosed methods, all of the stages after the formation of the buffer layer are not performed entirely by use of the liquid phase technique.

A method of forming an initial layer for the electrodeposition technique by use of the CBD technique has been disclosed. The CBD technique is the liquid phase technique that enables the formation of the zinc oxide film on a non-conductive underlayer. However, since zinc oxide is a wurtzite crystal, in cases where a morphology control agent (such as an organic molecule) for growth control of a specific crystal face, or the like, is not used particularly in the CBD technique, a growth rate in the c-axis direction of the crystal is ordinarily quick, and the crystal is apt to grow in a rod-like shape. As a result, large rod-shaped crystals deposit, and a film is not formed. Even though a film is formed, a film structure, wherein a plurality of fine rod-shaped crystals stand side by side with a spacing being left therebetween, is obtained. It is thus not always possible to appropriately cover the underlayer.

As methods of controlling the crystal growth and forming a zinc oxide film which appropriately covers an underlayer, there have been proposed the methods, wherein a plurality of metal fine particles are imparted to the underlayer, and wherein a zinc oxide film is then formed with the CBD technique. In Japanese Patent No. 4081625, a method is disclosed, wherein an underlayer is catalyzed with an activator containing Ag ions, and wherein a zinc oxide film is then formed by use of a zinc oxide deposition solution. For example, in paragraph 0026 of Japanese Unexamined Patent Publication No. 2002-020884, a method is described, wherein an underlayer is catalyzed with an activator containing Ag ions, wherein zinc oxide is then deposited with an electroless technique, and wherein energizing processing is performed in a zinc oxide deposition solution by utilizing the thus obtained ZnO deposit as a cathode and utilizing a zinc plate as an anode, whereby ZnO is grown. Similar techniques are also described in J. Katayama, "Application of ZnO Prepared with Soft Solution Processing and $Cu_2O$ Semiconductor Thin Film to Optoelectronics", Ritsumeikan University doctoral thesis, 2004; and H. Ishizaki et al., "Influence of $(CH_3)_2NHBH_3$ Concentration on Electrical Properties of Electrochemically Grown ZnO Films", Journal of The Electrochemical Society, Vol. 148, Issue 8, pp. C540-0543, 2001.

However, in cases where the electrically conductive zinc oxide film is formed ultimately by performing the steps up to the electrodeposition technique in accordance with each of the methods described in Japanese Unexamined Patent Publication No. 2002-020884; Japanese Patent No. 3445293; Japanese Patent No. 4081625; J. Katayama, "Application of ZnO Prepared with Soft Solution Processing and $Cu_2O$ Semiconductor Thin Film to Optoelectronics", Ritsumeikan University doctoral thesis, 2004; and H. Ishizaki et al., "Influence of $(CH_3)_2NHBH_3$ Concentration on Electrical Properties of Electrochemically Grown ZnO Films", Journal of The Electrochemical Society, Vol. 148, Issue 8, pp. C540-0543, 2001, a specific resistance value of the obtained electrically conductive zinc oxide film is as high as approximately $7.8 \times 10^{-3} \Omega \cdot cm$, which corresponds to a sheet resistance value of as high as approximately $200\Omega/\square$, and a resistance value satisfactory for the electrode layer is not obtained. (The resistance value described above is cited from J. Katayama, "Application of ZnO Prepared with Soft Solution Processing and $Cu_2O$ Semiconductor Thin Film to Optoelectronics", Ritsumeikan University doctoral thesis, 2004.) Also, in cases where the metal layer is used as the underlayer for the transparent conductive layer, since the metal layer affects a band gap, there is the risk that the device characteristics will become bad.

SUMMARY OF THE INVENTION

The primary object of the present invention is to provide a process for producing a photoelectric conversion device, wherein a high-quality transparent conductive layer that appropriately covers an underlayer is formed with a liquid phase technique such that a metal layer affecting a band gap structure within the photoelectric conversion device need not be formed, and wherein all film forming stages ranging from a stage of forming a buffer layer to a stage of forming the transparent conductive layer are performed with the liquid phase technique.

The present invention provides a process for producing a photoelectric conversion device comprising a bottom electrode layer, a photoelectric conversion semiconductor layer, a buffer layer, and a transparent conductive layer, which are stacked in this order on a substrate, wherein all film forming stages ranging from a stage of forming the buffer layer to a stage of forming the transparent conductive layer are performed with a liquid phase technique, the buffer layer is formed with a chemical bath deposition technique, and the transparent conductive layer is formed with an electrolytic deposition technique.

The term "transparent" as used herein means that the transmittance with respect to the sunlight is equal to at least 70%.

The process for producing a photoelectric conversion device in accordance with the present invention may be modified such that the substrate is constituted of a substrate that is provided with an electrical insulator layer on a front surface side on which the bottom electrode layer is to be formed and that is provided with a metal layer on a rear surface side, the bottom electrode layer is stacked on the front surface side of the substrate, and the transparent conductive layer is formed with the electrolytic deposition technique by utilizing the metal layer as a cathode.

In such cases, the process for producing a photoelectric conversion device in accordance with the present invention should preferably be modified such that the substrate is an anodized substrate selected from the group consisting of:

an anodized substrate comprising: (a) an Al base material containing Al as a principal ingredient, and (b) an anodic oxide film containing $Al_2O_3$ as a principal ingredient, the anodic oxide film being formed on one surface side of the Al base material, an anodized substrate comprising: (a) a composite base material which is constituted of an Fe material containing Fe as a principal ingredient, and an Al material containing Al as a principal ingredient, the Al material being composted on one surface side of the Fe material, and (b) an anodic oxide film containing $Al_2O_3$ as a principal ingredient, the anodic oxide film being formed on at least one surface side of the composite base material, and an anodized substrate comprising: (a) a base material which is constituted of an Fe material containing Fe as a principal ingredient, and an Al film containing Al as a principal ingredient, the Al film being formed on at least one surface side of the Fe material, and (b) an anodic oxide film containing $Al_2O_3$ as a principal ingredient, the anodic oxide film being formed on one surface side of the base material.

Also, the process for producing a photoelectric conversion device in accordance with the present invention should preferably be modified such that the substrate is an electrically insulating substrate, the photoelectric conversion semiconductor layer is formed on the bottom electrode layer such that a part of the bottom electrode layer is exposed, and a terminal is located at the exposed part of the bottom electrode layer, whereby the transparent conductive layer is formed with the electrolytic deposition technique by utilizing the bottom electrode layer as a cathode.

Further, the process for producing a photoelectric conversion device in accordance with the present invention should preferably be modified such that the bottom electrode layer contains Mo as a principal ingredient. The term "principal ingredient" as used herein means the ingredient whose content is equal to at least 80% by mass.

Furthermore, the process for producing a photoelectric conversion device in accordance with the present invention should preferably be modified such that the transparent conductive layer contains boron-doped zinc oxide as a principal ingredient.

Also, the process for producing a photoelectric conversion device in accordance with the present invention should preferably be modified such that the buffer layer is constituted of a Zn compound layer containing Zn (S, O) and/or Zn (S, O, OH) as a principal ingredient, the Zn compound layer is formed with the chemical bath deposition technique by use of a reaction mixture at a reaction temperature selected within the range of 70° C. to 95° C., the reaction mixture containing: an ingredient (Z) that comprises at least one zinc source, an ingredient (S) that comprises at least one sulfur source, an ingredient (C) that comprises at least one citrate compound, an ingredient (N) that comprises at least one of the members selected from the group consisting of ammonia and ammonium salts, and water, the concentration of the ingredient (C) in the reaction mixture being selected within the range of 0.001 to 0.25M, the concentration of the ingredient (N) in the reaction mixture being selected within the range of 0.001 to 0.40M, pH of the reaction mixture prior to beginning of the reaction being selected within the range of 9.0 to 12.0, and the thus formed Zn compound layer is subjected to annealing processing at a temperature selected within the range of 150° C. to 220° C. for a period of time selected within the range of 5 to 90 minutes.

Further, the process for producing a photoelectric conversion device in accordance with the present invention should preferably be modified such that a stage of forming a window layer on the buffer layer with a coating technique and/or the chemical bath deposition technique is performed between the stage of forming the buffer layer and the stage of forming the transparent conductive layer, and the stage of forming the transparent conductive layer is performed on the buffer layer such that the window layer intervenes between the buffer layer and the transparent conductive layer.

Furthermore, the process for producing a photoelectric conversion device in accordance with the present invention should preferably be modified such that the surface of the photoelectric conversion semiconductor layer, on which surface the buffer layer is to be formed, is subjected to surface treatment by being dipped in a reaction liquid adapted for removing impurities from the surface, and the buffer layer is formed on the photoelectric conversion semiconductor layer, which has been subjected to the surface treatment.

In such cases, the buffer layer should preferably be formed within 60 minutes after the surface treatment has been performed. The buffer layer should more preferably be formed within 10 minutes after the surface treatment has been performed.

The term "within 60 minutes after surface treatment has been performed" as used herein means the period of time having elapsed immediately after the surface treatment has been finished. In cases where a water washing stage and a drying stage are performed, the period of time described above includes the periods of time of the processing at the water washing stage and the drying stage.

The process for producing a photoelectric conversion device in accordance with the present invention is applicable appropriately in cases where a principal ingredient of the photoelectric conversion semiconductor layer is at least one compound semiconductor having a chalcopyrite structure. In such cases, the principal ingredient of the photoelectric conversion semiconductor layer may be at least one compound semiconductor comprising:

at least one Group-Ib element selected from the group consisting of Cu and Ag, at least one Group-IIIb element selected from the group consisting of Al, Ga, and In, and at least one Group-VIb element selected from the group consisting of S, Se, and Te.

Also, the process for producing a photoelectric conversion device in accordance with the present invention should preferably be modified such that the substrate is a flexible substrate, and all film forming stages, ranging from the stage of forming the buffer layer to the stage of forming the transparent conductive layer are performed with a roll-to-roll system.

In a first aspect of the roll-to-roll system, the film forming stages ranging from the stage of forming the buffer layer to the stage of forming the transparent conductive layer may be performed in an in-line mode. In a second aspect of the roll-to-roll system, each of all film forming stages ranging from the stage of forming the buffer layer to the stage of forming the transparent conductive layer may be performed with the roll-to-roll system, and the section between adjacent stages among all film forming stages may be performed in an off-line mode.

The term "in-line mode" as used herein means that the operations ranging from the step, in which a base material having been wound in a roll-shaped form is delivered to the production stages, to the step, in which the base material having been processed at the production stages is wound up around a roll, are performed with a single same cycle. The term "off-line mode" as used herein means that the base material having been processed at each production stage is temporarily wound up around a roll and is then supplied to a next production stage.

As described above, the inventors have found the film forming method, wherein a high-quality transparent conductive layer that appropriately covers the underlayer is formed with the electrolytic deposition technique such that a metal layer affecting a band gap structure within the photoelectric conversion device need not be formed. The utilization of the thus found film forming method has first enabled the process for producing a photoelectric conversion device, wherein all film forming stages ranging from the stage of forming the buffer layer to the stage of forming the transparent conductive layer are performed with the liquid phase technique. With the process for producing a photoelectric conversion device in accordance with the present invention, wherein the high-quality transparent conductive layer is formed, it is possible to produce the photoelectric conversion device, such as the solar cell, which has good device characteristics.

BRIEF DESCRIPTION OF THE DRAWINGS

FIGS. 1A to 1H are schematic sectional views showing a first embodiment of the process for producing a photoelectric conversion device in accordance with the present invention, FIG. 2A is a schematic sectional view showing an example of a constitution of an anodized substrate, FIG. 23 is a schematic sectional view showing a different example of a constitution of an anodized substrate, FIG. 3 is a perspective view showing a method of producing an anodized substrate, FIG. 6 is a schematic sectional view showing the process for producing a photoelectric conversion device in accordance with the present invention, in which a second aspect of a roll-to-roll system is employed.

DESCRIPTION OF THE PREFERRED EMBODIMENTS

The present invention will hereinbelow be described in further detail with reference to the accompanying drawings.

[Process for Producing a Photoelectric Conversion Device]

Embodiments of the process for producing a photoelectric conversion device in accordance with the present invention will be described hereinbelow with reference to FIGS. 1A to 1H and FIGS. 4A to 4E. FIGS. 1A to 1H are schematic sectional views showing a first embodiment of the process for producing a photoelectric conversion device (solar cell) 1 in accordance with the present invention. FIGS. 4A to 4E are schematic sectional views showing a second embodiment of the process for producing a photoelectric conversion device (solar cell) 1' in accordance with the present invention. For clearness, the scale, and the like, of each of the constituent elements are appropriately varied from the actual scale, and the like.

Figure 4A:
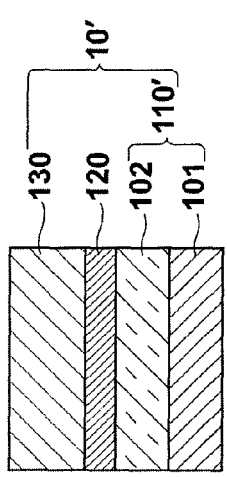
FIGS. 4A to 4E are schematic sectional views showing a second embodiment of the process for producing a photoelectric conversion device in accordance with the present invention.
Figure 4B:
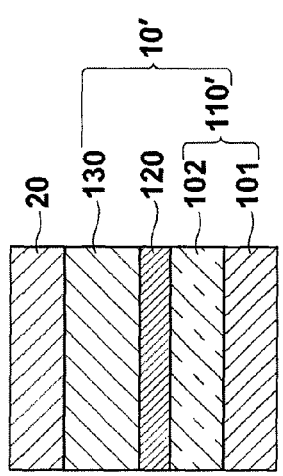
Figure 4C:
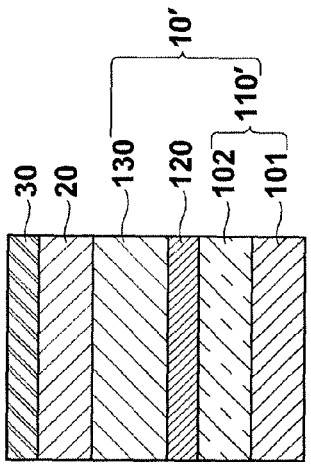
Figure 4D:
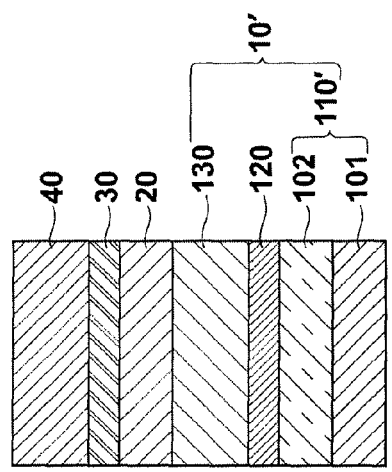
Figure 4E:
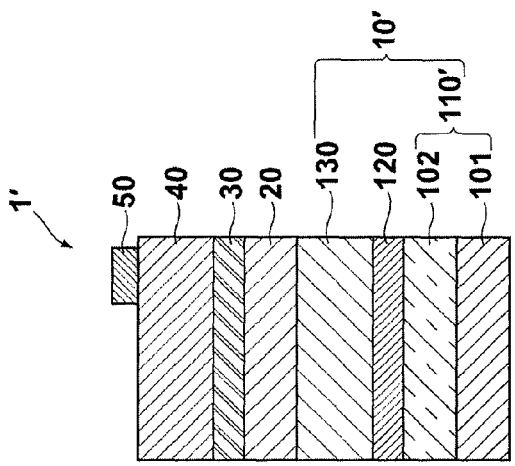

As illustrated in FIG. 1H or FIG. 4E, the photoelectric conversion device (solar cell) 1 (1') comprises a substrate 110 (110') and layers stacked on the substrate 110 (110'). The layers stacked on the substrate 110 (110') comprise a bottom electrode layer 120, a photoelectric conversion semiconductor layer 130 which generates positive hole-electron pairs through light absorption, a buffer layer 20, a protective layer (window layer) 30, a transparent conductive layer (transparent electrode) 40, and a top electrode layer 50. With the process for producing the photoelectric conversion device 1 (1') in accordance with the present invention, all film forming stages ranging from the stage of forming the buffer layer 20 to the stage of forming the transparent conductive layer 40 are performed with the liquid phase technique. The buffer layer 20 is formed with the chemical bath deposition technique. The transparent conductive layer 40 is formed with the electrolytic deposition technique (electrodeposition technique). As for each of the layers lower than the buffer layer 20, the layer forming technique is not limited particularly.

The transparent conductive layer 40 may be constituted of an ITO layer, which is popular currently, or a zinc oxide layer having been imparted with electrically conductive characteristics. The transparent conductive layer 40 should preferably be constituted of the electrically conductive zinc oxide layer, which is advantageous for abundance of resources and a lower cost. The transparent conductive layer 40 may be formed with the cathode electrodeposition technique.

In cases where the transparent conductive layer 40 is constituted of the electrically conductive zinc oxide layer, the electrically conductive zinc oxide layer should preferably contain a low-resistance electrically conductive zinc oxide as a principal ingredient. As the low-resistance electrically conductive zinc oxide, boron-doped zinc oxide is preferable.

In cases where the electrically conductive zinc oxide thin film layer is to be formed with the electrodeposition technique, it is preferable to use a reaction mixture for the electrodeposition technique, which contains zinc ions, nitrate ions, and at least one amine type borane compound (reducing agent). Examples of the amine type borane compounds include dimethylamine borane and trimethylamine borane. The reaction mixture should more preferably contain dimethylamine borane. An example of the reaction mixture is a reaction mixture containing zinc nitrate and dimethylamine borane.

In cases where the reaction mixture containing the zinc ions, the nitrate ions, and the amine type borane compound, such as dimethylamine borane, is used, the reaction conditions are not limited particularly. However, it is preferable to include a reaction stage in which the zinc ions and a complex formed from the amine type borane compound coexist with each other.

Principal reaction routes in the reaction mixture containing zinc nitrate and dimethylamine borane are thought to be as shown below.

$$Zn(NO_3)_2 \rightarrow Zn^{2+} + 2NO_3^- \tag{1}$$

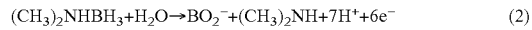

$$(CH_3)_2NHBH_3 + H_2O \rightarrow BO_2^- + (CH_3)_2NH + 7H^+ + 6e^- \tag{2}$$

$$NO_3^- + H_2O + 2e^- \rightarrow NO_2^- + 2OH^- \tag{3}$$

$$Zn^{2+} + 2OH^- \rightarrow Zn(OH)_2 \tag{4}$$

$$Zn(OH)_2 \rightarrow ZnO + H_2O \tag{5}$$

As for the reaction described above, the reaction should preferably be performed under pH conditions such that the solubility of ZnO is low. Relationships among the values of pH, the kinds of various Zn-containing ions present in the reaction mixture, and the solubilities of the various Zn-containing ions are described in, for example, FIG. 7 of S. Yamabi and H. Imai, "Growth conditions for wurtzite zinc oxide films in aqueous solutions", Journal of Materials Chemistry, Vol. 12, pp. 3773-3778, 2002. In the cases of the reaction described above, the solubility of ZnO is low within the pH range of 3.0 to 8.0, and the reaction proceeds appropriately within the aforesaid pH range. Specifically, in the cases of the reaction described above, the reaction proceeds appropriately under the mild pH conditions, which are not the strong acid or strong alkali conditions, and therefore the advantages are obtained in that little influence occurs on the substrate, and the like.

The reaction mixture containing the zinc ions, the nitrate ions, and the amine type borane compound, such as dimethylamine borane, may contain arbitrary ingredients other than the essential ingredients. The reaction mixture of the type described above may be of the aqueous type, does not require high reaction temperatures, and may be set under the mild pH conditions. Therefore, the reaction mixture of the type described above is preferable for a small environmental load.

As for the reaction conditions appropriate for the electrodeposition technique, the reaction temperature should be preferably selected within the range of 25° C. to 95° C., and should be more preferably selected within the range of 40° C. to 90° C. If the reaction temperature is higher than 95° C., in cases where water is employed as the solvent, the solvent will evaporate. Conversely, if the reaction temperature is lower than 25° C., it will often occur that the reaction rate becomes low. The reaction time may vary in accordance with the reaction temperature. The reaction time should be preferably selected within the range of 1 to 60 minutes, and should be more preferably selected within the range of 1 to 30 minutes. In the cases of the electrodeposition technique, it is preferable to perform the energizing processing at 0.5 to 5 coulomb per 1 cm². After the energizing processing has been performed, the substrate is taken out from the reaction mixture and is dried at the room temperature. In this manner, the electrically conductive zinc oxide thin film layer 40 is formed.

Ordinarily, as the energizing processing, there may be mentioned, for example, a technique wherein a film formation plane is taken as a working electrode, wherein a zinc plate is taken as a counter electrode, wherein a silver/silver chloride electrode is used as a reference electrode, wherein the reference electrode is dipped in a saturated KCl solution, wherein connection to a reaction mixture is made with a salt bridge, and wherein the energizing processing is thereby performed. In the cases of the photoelectric conversion device 1 (1'), the plane on which the transparent conductive layer 40 is to be formed is the buffer layer 20 or the window layer 30. Therefore, at the time at which the aforesaid cathode electrodeposition technique is performed, the film formation plane for the transparent conductive layer 40 cannot be used as the cathode. Accordingly, in the embodiments of the process for producing a photoelectric conversion device in accordance with the present invention, the electrodeposition technique is performed by using an electrical conductor layer, which is formed as a layer lower than the layer of the film formation plane, as the cathode.

The embodiments of the process for producing a photoelectric conversion device in accordance with the present invention include the first embodiment illustrated in FIGS. 1A to 1H and the second embodiment illustrated in FIGS. 4A to 4E. The first and second embodiments vary in constitution of the substrate (110, 110'). The mode of electrical conduction in the electrodeposition technique at the time of the formation of the transparent conductive layer 40 varies in accordance with the difference in constitution of the substrate (110, 110').

The constitution of the substrate (110, 110') employed in the process for producing a photoelectric conversion device in accordance with the present invention is not limited particularly. By way of example, the substrate may be constituted of a glass substrate. Alternatively, the substrate may be constituted of a metal substrate, such as a stainless steel substrate, which is provided with an electrical insulator film on a surface. As another alternative, the substrate may be constituted of an anodized substrate comprising: (a) an Al base material containing Al as a principal ingredient, and (b) an anodic oxide film containing $Al_2O_3$ as a principal ingredient, the anodic oxide film being formed on at least one surface side of the Al base material. As a further alternative, the substrate may be constituted of an anodized substrate comprising: (a) a composite base material which is constituted of an Fe material containing Fe as a principal ingredient, and an Al material containing Al as a principal ingredient, the Al material being composited on at least one surface side of the Fe material, and (b) an anodic oxide film containing $Al_2O_3$ as a principal ingredient, the anodic oxide film being formed on at least one surface side of the composite base material. As a still further alternative, the substrate may be constituted of an anodized substrate comprising: (a) a base material which is constituted of an Fe material containing Fe as a principal ingredient, and an Al film containing Al as a principal ingredient, the Al film being formed on at least one surface side of the Fe material, and (b) an anodic oxide film containing $Al_2O_3$ as a principal ingredient, the anodic oxide film being formed on at least one surface side of the base material. As another alternative, the substrate may be constituted of a resin substrate, such as a polyimide substrate.

For the possibility of the production with successive stages, the substrate should preferably be constituted of a flexible substrate, such as the metal substrate, which is provided with the electrical insulator film on the surface, the anodized substrate, or the resin substrate.

In the first embodiment of the process for producing a photoelectric conversion device in accordance with the present invention, the substrate 110 constituted of an electrically insulating substrate is employed. By way of example, the electrically insulating substrate may be constituted of a glass substrate. Alternatively, the electrically insulating substrate may be constituted of a resin substrate, such as a polyimide substrate. As another alternative, the electrically insulating substrate may be constituted of an anodized substrate (as illustrated in FIG. 2A) comprising: (a) an Al base material 101 containing Al as a principal ingredient, and (b) anodic oxide films 102, 102 containing $Al_2O_3$ as a principal ingredient, the anodic oxide films 102, 102 being formed respectively on a front surface and a rear surface of the Al base material 101. As a further alternative, the electrically insulating substrate may be constituted of an anodized substrate comprising: (a) a composite base material which is constituted of an Fe material containing Fe as a principal ingredient, and Al materials containing Al as a principal ingredient, the Al materials being composited respectively on a front surface and a rear surface of the Fe material, and (b) anodic oxide films containing $Al_2O_3$ as a principal ingredient, the anodic oxide films being formed respectively on a front surface and a rear surface of the composite base material. As a still further alternative, the electrically insulating substrate may be constituted of an anodized substrate comprising: (a) a base material which is constituted of an Fe material containing Fe as a principal ingredient, and Al films containing Al as a principal ingredient, the Al films being formed respectively on a front surface and a rear surface of the Fe material, and (b) anodic oxide films containing $Al_2O_3$ as a principal ingredient, the anodic oxide films being formed respectively on a front surface and a rear surface of the base material.

In this embodiment, as illustrated in FIG. 1F, the photoelectric conversion semiconductor layer 130, the buffer layer 20, and the window layer 30 (in cases where the window layer 30 is not formed, the photoelectric conversion semiconductor layer 130 and the buffer layer 20) are formed such that a part of the bottom electrode layer 120 is exposed. Thereafter, a terminal T is formed at the exposed part of the bottom electrode layer 120 (as illustrated in FIG. 1G). The bottom electrode layer 120 is thus utilized as the cathode, and the transparent conductive layer 40 is formed with the electrodeposition technique.

Therefore, in the first embodiment of the process for producing a photoelectric conversion device in accordance with the present invention, firstly, as illustrated in FIG. 1A, the bottom electrode layer 120 is formed on the electrically insulating substrate 110. Thereafter, as illustrated in FIG. 1B, the part of the bottom electrode layer 120, at which part the terminal T is to be formed, is covered by a mask M. As illustrated in FIG. 1C, the photoelectric conversion semiconductor layer 130 is then formed on the region of the bottom electrode layer 120 other than the part covered by the mask M. As illustrated in FIG. 1D, the mask M is removed, and a layered substrate 10 is thus produced. Thereafter, as illustrated in FIGS. 1E and 1F, the buffer layer 20 and the window layer 30 are formed in this order on the photoelectric conversion semiconductor layer 130. As illustrated in FIG. 1G, the energizing processing is performed from the terminal T having been formed at the exposed part of the bottom electrode layer 120, and the transparent conductive layer 40 is thus formed on the window layer 30 with the electrodeposition technique. As a technique for forming and removing the mask M, a photolithography technique, or the like, may be employed.

In the second embodiment of the process for producing the photoelectric conversion device 1' in accordance with the present invention, the substrate 110' is employed. The substrate 110' is provided with an electrical insulator layer on a front surface, on which the bottom electrode layer 120 is to be formed. The substrate 110' is also provided with a metal layer on a rear surface. With the constitution utilizing the substrate 110', it is possible for the transparent conductive layer 40 to be formed with the electrodeposition technique by utilizing the metal layer on the rear surface of the substrate 110' as the cathode. Therefore, it is not necessary to perform the stage of the patterning of the photoelectric conversion semiconductor layer 130 as in the first embodiment, and the processing is kept easy.

Though not limited particularly, the substrate 110' should preferably be constituted of an anodized substrate (as illustrated in FIG. 2B) comprising: (a) the Al base material 101 containing Al as a principal ingredient, and (b) the anodic oxide film 102 containing $Al_2O_3$ as a principal ingredient, the anodic oxide film 102 being formed on one surface side of the Al base material 101. Alternatively, the substrate 110' should preferably be constituted of an anodized substrate comprising: (a) a composite base material which is constituted of an Fe material containing Fe as a principal ingredient, and an Al material containing Al as a principal ingredient, the Al material being composited on at least one surface side of the Fe material, and (b) an anodic oxide film containing $Al_2O_3$ as a principal ingredient, the anodic oxide film being formed on one surface side of the composite base material. As another alternative, the substrate 110' should preferably be constituted of an anodized substrate comprising: (a) a base material which is constituted of an Fe material containing Fe as a principal ingredient, and an Al film containing Al as a principal ingredient, the Al film being formed on at least one surface side of the Fe material, and (b) an anodic oxide film containing $Al_2O_3$ as a principal ingredient, the anodic oxide film being formed on one surface side of the base material.

In the second embodiment of the process for producing a photoelectric conversion device in accordance with the present invention, firstly, as illustrated in FIG. 4A, a layered substrate 10' is prepared. The layered substrate 10' comprises the anodized substrate 110'. The layered substrate 10' also comprises the bottom electrode layer 120 and the photoelectric conversion semiconductor layer 130, which are stacked in this order on the anodized substrate 110'. As illustrated in FIGS. 4B and 4C, the buffer layer 20 and the window layer 30 are then formed in this order on the photoelectric conversion semiconductor layer 130 of the layered substrate 10'. Thereafter, as illustrated in FIG. 4D, the transparent conductive layer 40 is formed on the window layer 30 with the electrodeposition technique by utilizing the metal layer 101 of the substrate 110' as the cathode.

In each of the first and second embodiments of the process for producing a photoelectric conversion device in accordance with the present invention, after the transparent conductive layer 40 has been formed, a top electrode (grid electrode) 50 is formed according to a pattern on the transparent conductive layer 40. In this manner, as illustrated in FIG. 1H or FIG. 4E, the photoelectric conversion device 1 or the photoelectric conversion device 1' is obtained.

The anodized substrate is the substrate material preferable also from the view point of the flexibility, the coefficient of thermal expansion, the heat resistance, and the electrically insulating characteristics of the substrate. FIG. 2A is a schematic sectional view showing an example of a constitution of the anodized substrate 110. FIG. 2B is a schematic sectional view showing an example of a constitution of the anodized substrate 110'.

The anodized substrate 110 (110') is the substrate obtained by anodizing at least one surface side of the Al base material 101 containing Al as the principal ingredient. As illustrated in FIG. 2A, the anodized substrate may be the anodized substrate 110 comprising the Al base material 101, and the anodic oxide films 102, 102 formed on both surface sides of the Al base material 101. Alternatively, as illustrated in FIG. 2B, the anodized substrate may be the anodized substrate 110' comprising the Al base material 101, and the anodic oxide film 102 formed on one surface side of the Al base material 101. The anodic oxide film 102 is the film containing $Al_2O_3$ as the principal ingredient.

In order for substrate warpage, which occurs due to a difference in coefficient of thermal expansion between Al and $Al_2O_3$, film peeling due to the substrate warpage, and the like, to be suppressed during device production stages, it is preferable to employ the anodized substrate 110 comprising the Al base material 101, and the anodic oxide films 102, 102 formed on both surface sides of the Al base material 101 as illustrated in FIG. 2A.

The anodizing processing may be performed in the manner described below. Specifically, if necessary, the Al base material 101 may be subjected to washing processing, polishing and smoothing processing, and the like. The Al base material 101 is then set as an anode and is immersed together with a cathode in an electrolyte. In this state, a voltage is applied between the anode and the cathode. The cathode may be constituted of carbon, aluminum, or the like. Also, no limitation is imposed upon the kind of the electrolyte. However, the electrolyte should preferably be an acidic electrolyte containing at least one kind of an acid selected from the group consisting of sulfuric acid, phosphoric acid, chromic acid, oxalic acid, sulfamic acid, benzenesulfonic acid, and amidosulfonic acid.

The anodizing conditions are not limited particularly and may vary in accordance with the kind of the electrolyte used. For example, the anodizing conditions should preferably be set such that the electrolyte concentration is selected within the range of 1% by mass to 80% by mass, the electrolyte temperature is selected within the range of 5° C. to 70° C., the electric current density is selected within the range of 0.005 $A/cm^2$ to 0.60 $A/cm^2$, the applied voltage is selected within the range of 1V to 200V, and the electrolysis time is selected within the range of 3 to 500 minutes.

As the electrolyte, it is preferable to employ sulfuric acid, phosphoric acid, oxalic acid, or a mixture of two or more of them. In cases where the electrolyte as described above is employed, the anodizing conditions should preferably be set such that the electrolyte concentration is selected within the range of 4% by mass to 30% by mass, the electrolyte temperature is selected within the range of 10° C. to 30° C., the electric current density is selected within the range of 0.05 $A/cm^2$ to 0.30 $A/cm^2$, and the applied voltage is selected within the range of 30V to 150V.

As illustrated in FIG. 3, in cases where the anodizing processing is performed on the Al base material 101 containing Al as the principal ingredient, the oxidation reaction advances from a surface 101s of the Al base material 101 toward the direction approximately normal to the surface 101s. The anodic oxide film 102 containing $Al_2O_3$ as the principal ingredient is formed in this manner. The anodic oxide film 102 having been formed with the anodizing processing has a structure, in which a plurality of fine pillar-shaped bodies 102a, 102a, . . . having approximately regular hexagon shapes, as viewed from above, are arrayed without a spacing being left among them. At an approximately middle area of each of the fine pillar-shaped bodies 102a, 102a, . . . , a fine hole 102b extending approximately straightly in the depth direction from the surface 101s is formed. Also, a bottom surface of each of the fine pillar-shaped bodies 102a, 102a, . . . has a round shape. Ordinarily, a barrier layer free from the fine hole 102b is formed at the bottom of each of the fine pillar-shaped bodies 102a, 102a, . . . . By the adjustment of the anodizing conditions, it is also possible to form the anodic oxide film 102 free from the fine holes 102b, 102b, . . . .

No limitation is imposed upon the thickness of the Al base material 101 and the thickness of the anodic oxide film 102. In cases where the mechanical strength of the substrate 110', the reduction of the thickness and the weight of the substrate 110', and the like, are taken into consideration, the thickness of the Al base material 101 prior to the anodizing processing should be preferably selected within the range of, for example, 0.05 mm to 0.6 mm, and should be more preferably selected within the range of, for example, 0.1 mm to 0.3 mm. In cases where the electrically insulating characteristics of the substrate, the mechanical strength of the substrate, and the reduction of the thickness and the weight of the substrate are taken into consideration, the thickness of the anodic oxide film 102 should be preferably selected within the range of, for example, 0.1 µm to 100 µm.

The constitution common to the photoelectric conversion device 1 and the photoelectric conversion device 1' will be described hereinbelow.

(Bottom Electrode Layer)

No limitation is particularly imposed upon the technique for forming the bottom electrode layer 120. The bottom electrode layer 120 should preferably be formed with a vapor phase film forming technique, such as a sputtering technique or a vacuum evaporation technique. No limitation is particularly imposed upon the principal ingredient of the bottom electrode layer 120. The principal ingredient of the bottom electrode layer 120 should preferably be Mo, Cr, W, or a combination of at least two of them. The principal ingredient of the bottom electrode layer 120 should more preferably be Mo.

No limitation is imposed upon the film thickness of the bottom electrode layer (rear surface electrode) 120. The film thickness of the bottom electrode layer 120 should preferably selected within the range of approximately 200 nm to approximately 1,000 nm.

(Photoelectric Conversion Semiconductor Layer)

No limitation is particularly imposed upon the principal ingredient of the photoelectric conversion semiconductor layer 130. In order for a high photoelectric conversion efficiency to be obtained, the principal ingredient of the photoelectric conversion semiconductor layer 130 should preferably be at least one compound semiconductor having the chalcopyrite structure. The compound semiconductor having the chalcopyrite structure should more preferably be at least one compound semiconductor comprising a Group-Ib element, a Group-IIIb element, and a Group-VIb element.

The principal ingredient of the photoelectric conversion semiconductor layer 130 should preferably be at least one compound semiconductor comprising:

at least one Group-Ib element selected from the group consisting of Cu and Ag, at least one Group-IIIb element selected from the group consisting of Al, Ga, and In, and at least one Group-VIb element selected from the group consisting of S, Se, and Te.

Examples of the aforesaid compound semiconductors include:

$CuAlS_2$/$CuGaS_2$, $CuInS_2$,
$CuAlSe_2$, $CuGaSe_2$,
$AgAlS_2$, $AgGaS_2$, $AgInS_2$,
$AgAlSe_2$, $AgGaSe_2$, $AgInSe_2$,
$AgAlTe_2$, $AgGaTe_2$, $AgInTe_2$,
$Cu(In,Al)Se_2$, $Cu(In,Ga)(S,Se)_2$,
$Cu_{1-z}In_{1-x}Ga_xSe_{2-y}S_y$, wherein $0 \leq x \leq 1$, $0 \leq y \leq 2$, and $0 \leq z \leq 1$ (CI (G)S),
$Ag(In,Ga)Se_2$, and $Ag(In,Ga)(S,Se)_2$.

No limitation is particularly imposed upon the technique for forming the photoelectric conversion semiconductor layer 130. For example, for the formation of the CI (G)S type photoelectric conversion semiconductor layer containing Cu, In, (Ga), and S, it is possible to employ a selenization technique, a multi-source deposition technique, or the like.

No limitation is particularly imposed upon the film thickness of the photoelectric conversion semiconductor layer 130. The film thickness of the photoelectric conversion semiconductor layer 130 should be preferably selected within the range of 1.0 µm to 3.0 µm, and should be more preferably selected within the range of 1.5 µm to 2.0 µm.

(Buffer Layer)

The buffer layer 20 is formed for the purposes of (1) prevention of recombination of photogenerated carriers, (2) matching of band discontinuity, (3) lattice matching, and (4) coverage of surface unevenness of the photoelectric conversion layer.

No limitation is particularly imposed upon the principal ingredient of the buffer layer 20. The buffer layer 20 should preferably contain a metal sulfide containing at least one metal element selected from the group consisting of Cd, Zn, In, and Sn. For example, the buffer layer 20 should preferably contain CdS, Zn (S,O), and/or Zn (S, O, OH). The buffer layer 20 should preferably be formed with the chemical bath deposition technique (CBD technique).

In the cases of the CI (G) S type of the photoelectric conversion semiconductor layer, there is a high possibility that detrimental impurities, such as copper selenide and copper sulfide, remain on the surface of the CI (G)S type of the photoelectric conversion semiconductor layer having been formed. Therefore, in the cases of the CI (G) S type of the photoelectric conversion semiconductor layer, before the film formation of the buffer layer is performed at the subsequent stage, a stage of removing the impurities from the surface of the photoelectric conversion semiconductor layer should preferably be performed.

No limitation is imposed upon the technique for removing the impurities. For example, it is possible to employ a technique, wherein etching is performed by dipping the film surface in an aqueous solution containing 0.1 to 10 wt. % of KCN.

Also, in the cases of the CI (G)S type of the photoelectric conversion semiconductor layer, the unevenness of the surface of the formed film is high. Therefore, the surface of the CI (G) S type of the photoelectric conversion semiconductor layer should preferably be subjected to smoothing processing. As the smoothing process, it is possible to employ, for example, etching processing utilizing an aqueous solution containing bromine (in a bromine concentration of, for example, at most 1 mol/l).

In cases where the buffer layer 20 is formed on the photoelectric conversion semiconductor layer 130 having been subjected to the surface treatment for the removal of the impurities, the film formation of the buffer layer 20 should preferably be performed as early as possible after the surface treatment has been performed. The inventors have confirmed that, in cases where the film formation of the buffer layer 20 is performed within 60 minutes after the surface treatment has been performed, in-plane variation in photoelectric conversion efficiency is suppressed, and the photoelectric conversion efficiency is enhanced. Also, the inventors have confirmed that, in cases where the film formation of the buffer layer 20 is performed within 10 minutes after the surface treatment has been performed, the in-plane variation in photoelectric conversion efficiency is suppressed efficiently, and the photoelectric conversion efficiency is enhanced even further.

No limitation is particularly imposed upon the film thickness of the buffer layer 20. The film thickness of the buffer layer 20 should be preferably selected within the range of 10 nm to 2 µm, and should be more preferably selected within the range of 15 nm to 200 nm.

In cases where the buffer layer 20 is the layer containing CdS as the principal ingredient, the buffer layer 20 should preferably be formed with the CBD technique by use of a reaction mixture containing an aqueous $CdSO_4$ solution, an aqueous thiourea solution, and an aqueous ammonia solution in predetermined quantities. As the reaction mixture, it is also possible to employ, for example, a reaction mixture containing 0.0001 M of $CdSO_4$, 0.10M of an aqueous thiourea solution, and 2.0M of an aqueous ammonia solution.

With the aforesaid technique for forming the buffer layer 20, the reaction temperature should be preferably selected within the range of 70° C. to 95° C. For example, in cases where the reaction temperature is 80° C., the reaction time may fall within the range of approximately 15 minutes to approximately 20 minutes. Though CdS is the material appropriate for the buffer layer, Cd has a strong toxicity and is not preferable from the view point of environmental load. Therefore, as the buffer layer 20, it is more preferable to employ a Zn compound layer containing Zn (S, O) and/or Zn (S, O, OH) as the principal ingredient.

In cases where the buffer layer 20 is constituted of the Zn compound layer containing Zn (S, O) and/or Zn (S, O, OH) as the principal ingredient, the Zn compound layer should preferably be formed with the chemical bath deposition technique by use of a reaction mixture at a reaction temperature selected within the range of 70° C. to 95° C., the reaction mixture containing: an ingredient (Z) that comprises at least one zinc source, an ingredient (S) that comprises at least one sulfur source, an ingredient (C) that comprises at least one citrate compound, an ingredient (N) that comprises at least one of the members selected from the group consisting of ammonia and ammonium salts, and water, the concentration of the ingredient (C) in the reaction mixture being selected within the range of 0.001 to 0.25M, the concentration of the ingredient (N) in the reaction mixture being selected within the range of 0.001 to 0.40M, pH of the reaction mixture prior to beginning of the reaction being selected within the range of 9.0 to 12.0.

Also, the thus formed Zn compound layer should more preferably be subjected to annealing processing at a temperature selected within the range of 150° C. to 220° C. for a period of time selected within the range of 5 to 90 minutes.

The film forming technique, which may be employed in cases where the buffer layer 20 is constituted of the Zn compound layer containing Zn (S, O) and/or Zn (S, O, OH) as the principal ingredient, will be described hereinbelow.

<Fine Particle Layer Forming Stage>

The buffer layer 20 does not necessarily require a fine particle layer forming stage for forming a fine particle layer acting as a nucleus, a catalyst, or the like, for crystal growth prior to the stage of forming the buffer layer 20. However, the fine particle layer forming stage may be performed prior to the stage of forming the buffer layer 20. In cases where the technique for forming the buffer layer 20 is provided with the fine particle layer forming stage, the reaction rate at the stage of forming the buffer layer 20 is enhanced even further.

No limitation is particularly imposed upon the composition of the fine particle layer. The fine particle layer should preferably be constituted of a semiconductor. Since the layer formed at the post-stage is of the Zn type, the fine particle layer should more preferably be constituted of a layer comprising at least one kind of a plurality of fine particles containing, as a principal ingredient, at least one of the members selected from the group consisting of ZnS, Zn(S,O), and Zn(S, O, OH).

No limitation is imposed upon the technique for forming the fine particle layer. It is preferable to employ, for example, a technique wherein a dispersion containing a plurality of the fine particles is coated, or a technique wherein a plurality of the fine particles are deposited by use of the CBD technique.

<Stage of Forming the Buffer Layer>

No limitation is particularly imposed upon the technique for forming the Zn compound layer, which contains Zn(S,O) and/or Zn (S, O, OH) as the principal ingredient, by use of the liquid phase technique. For the formation of the Zn compound layer, it is preferable to employ the CBD technique, or the like.

The CBD technique is the technique wherein a crystal is deposited on a substrate at an adequate rate in a stable environment by using a metal ion solution, which has a concentration and pH such that supersaturation conditions are obtained through equilibrium as represented by the general formula $[M(L)_i]^{n+} \Leftrightarrow M^{n+} + iL$ (wherein M represents a metal element, L represents a ligand, and each of n, and i represents a positive number), as a reaction mixture, and forming a complex of the metal ion M. As the technique for depositing a plurality of fine particles on a substrate with the CBD technique, there may be mentioned a technique described in, for example, G. Hodes, "Semiconductor and ceramic nanoparticle films deposited by chemical bath deposition", Physical Chemistry Chemical Physics, Vol. 9, pp. 2181-2196, 2007.

Preferable compositions of the reaction mixture will be described hereinbelow.

No limitation is imposed upon the kind of the ingredient (Z). The ingredient (Z) should preferably contain at least one of the members selected from the group consisting of zinc sulfate, zinc acetate, zinc nitrate, zinc citrate, and hydrates of the above-enumerated zinc salts. In cases where zinc citrate is employed as the ingredient (Z), zinc citrate acts also as the ingredient (C).

No limitation is particularly imposed upon the concentration of the ingredient (Z). The concentration of the ingredient (Z) should be preferably selected within the range of 0.001 to 0.5M.

No limitation is particularly imposed upon the kind of the ingredient (S). The ingredient (S) should preferably contain thiourea.

No limitation is particularly imposed upon the concentration of the ingredient (S). The concentration of the ingredient (S) should be preferably selected within the range of 0.01 to 1.0M.

The ingredient (C) is the ingredient acting as a complex forming agent, or the like. By the optimization of the kind and the concentration of the ingredient (C), the complex is formed easily.

By the utilization of the ingredient (C) that comprises at least one citrate compound, the complex is formed more easily than with a reaction mixture which does not contain the citrate compound. Also, in such cases, the crystal growth by the CBD reaction is controlled appropriately, and the film appropriately covering the underlayer is formed reliably.

No limitation is imposed upon the kind of the ingredient (C). The ingredient (C) should preferably contain sodium citrate and/or a hydrate thereof. The concentration of the ingredient (C) is selected within the range of 0.001 to 0.25M. In cases where the concentration of the ingredient (C) is selected within the aforesaid range, the complex is formed appropriately, and the film appropriately covering the underlayer is formed reliably. If the concentration of the ingredient (C) is higher than 0.25M, though a stable aqueous solution in which the complex has been formed appropriately will be obtained, the problems will often occur in that the progress of the depositing reaction onto the substrate becomes slow, or in that the reaction does not progress at all. The concentration of the ingredient (C) should be preferably selected within the range of 0.001 to 0.1 M.

The ingredient (N) is the ingredient acting as a pH adjustor. The ingredient (N) also acts as a complex forming agent, or the like. No limitation is particularly imposed upon the ammonium salt appropriate for use as the ingredient (N). The ammonium salt may be $NH_4OH$, or the like.

The concentration of the ingredient (N) is selected within the range of 0.001 to 0.40M. By the ingredient (N), pH is adjusted, and the solubility and the supersaturation degree of the metal ions are adjusted. In cases where the concentration of the ingredient (N) is selected within the range of 0.001 to 0.40M, a high reaction rate is obtained. Therefore, even if the fine particle layer forming stage is not performed prior to the stage of forming the buffer layer 20, the formation of the buffer layer 20 is performed at a practicable production rate. If the concentration of the ingredient (N) is higher than 0.40M, the reaction rate will become slow, and it will become necessary to contrive, for example, to form the fine particle layer prior to the stage of forming the buffer layer 20. The concentration of the ingredient (N) should be preferably selected within the range of 0.01 to 0.30M.

The pH value of the reaction mixture prior to the beginning of the reaction is selected within the range of 9.0 to 12.0.

If the pH value of the reaction mixture prior to the beginning of the reaction is lower than 9.0, the problems will occur in that the decomposition reaction of the ingredient (S), such as thiourea, does not proceed, or in that, even though the decomposition reaction of the ingredient (S) proceeds, the rate of the decomposition reaction is markedly slow. Therefore, in such cases, the deposition reaction does not proceed. The decomposition reaction of thiourea is represented by the formulas shown below. The decomposition reaction of thiourea is described in, for example, J. M. Dona and J. Herrero, "process and Film Characterization of Chemical-Bath-Deposited ZnS Thin Films", J. Electrochem. Soc., Vol. 141, No. 1, pp. 205-209, 1994; and F. Göde et al., "Investigations on the physical properties of the polycrystalline ZnS thin films deposited by the chemical bath deposition method", Journal of Crystal Growth, Vol. 299, pp. 136-141, 2007.

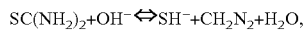

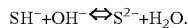

If the pH value of the reaction mixture prior to the beginning of the reaction is higher than 12.0, the effect of the ingredient (N), which also acts as the complex forming agent, or the like, upon the preparation of a stable solution will become large, and therefore the problems will occur in that the deposition reaction does not proceed, or in that, even though the deposition reaction proceeds, the rate of the deposition reaction is markedly slow. The pH value of the reaction mixture prior to the beginning of the reaction should be preferably selected within the range of 9.5 to 11.5.

In cases where the concentration of the ingredient (N) is selected within the range of 0.001 to 0.40M, particular pH adjustment need not be made, for example, by use of a pH adjustor other than the ingredient (N), and the pH value of the reaction mixture prior to the beginning of the reaction ordinarily is selected within the range of 9.0 to 12.0.

No limitation is particularly imposed upon the pH value of the reaction mixture after the completion of the reaction. The pH value of the reaction mixture after the completion of the reaction should be preferably selected within the range of 7.5 to 11.0. If the pH value of the reaction mixture after the completion of the reaction is lower than 7.5, the film forming stage will be thought to have included a period during which the reaction does not proceed, and the production will not be achieved efficiently. Also, in cases where the decrease in pH value to the extent described above occurs in the system containing ammonia having the buffering effect, there is a high possibility that ammonia will have been vaporized excessively during the heating stage, and it is considered that an improvement need be made with regard to the production. If the pH value of the reaction mixture after the completion of the reaction is higher than 11.0, though the decomposition of thiourea will be promoted, the problems will often occur in that, since most of the zinc ions become stable as the ammonium complex, the progress of the deposition reaction becomes markedly slow. The pH value of the reaction mixture after the completion of the reaction should be more preferably selected within the range of 9.5 to 10.5.

In the cases of the reaction mixture described above, particular pH adjustment need not be made, for example, by use of a pH adjustor other than the ingredient (N), and the pH value of the reaction mixture after the completion of the reaction is ordinarily selected within the range of 7.5 to 11.0.

The reaction temperature is selected within the range of 70° C. to 95° C. If the reaction temperature is lower than 70° C., the reaction rate will become slow, and the problems will occur in that the thin film does not grow, or in that, even though the thin film grows, a desired film thickness (e.g., at least 50 nm) is not always obtained at a practicable reaction rate. If the reaction temperature is higher than 95° C., the occurrence of bubbles, and the like, in the reaction mixture will increase, and a flat uniform film will hardly grow due to the bubbles clinging to the film surface. Also, in cases where the reaction is performed in an open system, change in concentration arises due to solvent evaporation, and the like, and the stable thin film deposition conditions are not always kept. The reaction temperature should be preferably selected within the range of 80° C. to 90° C.

No limitation is particularly imposed upon the reaction time. In the process for producing a photoelectric conversion device in accordance with the present invention, even if the fine particle layer is not provided, the reaction proceeds at a practicable reaction rate. The reaction time may fall within the range of, for example, 10 to 60 minutes, depending upon the reaction temperature, and a layer which appropriately covers the underlayer and which has a thickness sufficient for the buffer layer is formed with the aforesaid reaction time.

Further, the reaction mixture described above is of the aqueous system. The pH condition of the reaction mixture is not of the strong acid condition. Though the pH value of the reaction mixture may fall within the range of 11.0 to 12.0, the reaction proceeds even under the mild pH condition lower than 11.0. Also, the reaction temperature need not be markedly high. Therefore, with the reaction in the process for producing a photoelectric conversion device in accordance with the present invention, the environmental load is small, and damage to the substrate is suppressed.

After the buffer layer 20 has been formed with the CBD technique, the buffer layer 20 should more preferably be subjected to the annealing processing at a temperature selected within the range of 150° C. to 220° C. for a period of time selected within the range of 5 to 90 minutes. For example, in cases where the temperature of the annealing processing is 200° C., the annealing processing should preferably be performed for a period of time of 60 minutes.

The Zn type buffer layer formed in the manner described above appropriately covers the underlayer and is formed at a practicable reaction rate.

(Window Layer)

Thereafter, the window layer (protective layer) 30 is formed (FIG. 1F, FIG. 4C). The window layer 30 is the intermediate layer for taking in light. In so far as the window layer 30 has the transparency for taking in the light, no limitation is particular imposed upon the window layer 30. With the band gap being taken into consideration, the composition of the window layer 30 should preferably be i-ZnO, or the like. No limitation is particularly imposed upon the film thickness of the window layer 30. The film thickness of the window layer 30 should be preferably selected within the range of 10 nm to 2 μm, and should be more preferably selected within the range of 15 nm to 200 nm.

In so far as the liquid phase technique is employed, no limitation is particularly imposed upon the technique for forming the window layer 30. The window layer 30 may be formed with the technique of applying a fine particle dispersion onto the underlayer, the CBD technique, or a combination of the technique of applying a fine particle dispersion onto the underlayer and the CBD technique. The photoelectric conversion device need not necessarily be provided with the window layer 30.

(Transparent Conductive Layer)

The transparent conductive layer (transparent electrode) 40 is the layer for taking in the light and acting as the electrode which pairs with the bottom electrode layer 120 so as to flow the positive hole-electron pairs having been generated in the photoelectric conversion semiconductor layer 130. The transparent conductive layer 40 may be formed with the preferable material and the preferable production technique described above.

(Top Electrode)

No limitation is particularly imposed upon the principal ingredient of the top electrode 50. By way of example, the principal ingredient of the top electrode 50 may be Al. No limitation is particularly imposed upon the film thickness of the top electrode 50. The film thickness of the top electrode 50 should be preferably selected within the range of 0.1 μm to 3 μm.

In the embodiments of the process for producing a photoelectric conversion device in accordance with the present invention, wherein the film formation plane for the transparent conductive layer 40 cannot be taken as the cathode in the electrodeposition technique, the electrical conductor layer formed at the position lower than the film formation plane for the transparent conductive layer 40 is taken as the cathode. Therefore, in cases where the distance between the cathode layer and the film formation plane for the transparent conductive layer 40 is as short as possible, the energizing state becomes good. Accordingly, the film thickness of each of the layers located between the cathode layer and the film formation plane for the transparent conductive layer 40 should preferably be as thin as possible within the preferable range of the film thickness of each layer described above. Since the preferable film thickness of each layer varies in accordance with the magnitude of the electrical resistance value of each layer, the film thickness of each layer may be designed such that the appropriate electrodeposition technique is enabled in accordance with the layer constitution.

In each of the embodiments, the photoelectric conversion device 1 (1') is produced in the manner described above.

The photoelectric conversion device 1 (1') is adapted for use as the solar cell, or the like. The photoelectric conversion device 1 (1') may further be provided with a cover glass, a protective film, or the like, as required, and may thus be constituted as the solar cell.

As described above, each of the embodiments of the process for producing the photoelectric conversion device 1 (1') in accordance with the present invention has enabled the high-quality transparent conductive layer 40 that appropriately covers the underlayer to be formed with the electrodeposition technique such that a metal layer affecting the band gap structure within the photoelectric conversion device 1 (1') need not be formed. Thus each of the embodiments has first enabled the process for producing the photoelectric conversion device 1 (1'), wherein all film forming stages ranging from the stage of forming the buffer layer 20 to the stage of forming the transparent conductive layer 40 are performed with the liquid phase technique. With the process for producing the photoelectric conversion device 1 (1') in accordance with the present invention, wherein the high-quality transparent conductive layer 40 is formed, it is possible to produce the photoelectric conversion device 1 (1'), such as the solar cell, which has good device characteristics.

With the process for producing a photoelectric conversion device in accordance with the present invention, wherein the substrate may be a flexible substrate, it is possible to employ the roll-to-roll system, which enables the successive film formation of the respective layers on a large-area substrate. As described above, with each of the embodiments of the process for producing a photoelectric conversion device in accordance with the present invention, all film forming stages ranging from the stage of forming the buffer layer 20 to the stage of forming the transparent conductive layer 40 are performed with the liquid phase technique. Therefore, the film forming technique with the roll-to-roll system is capable of being applied appropriately to each of the embodiments of the process for producing a photoelectric conversion device in accordance with the present invention.

The roll-to-roll system is the system for performing the processing, wherein the flexible substrate having been wound in a roll-shaped form is delivered, intermittently or continuously conveyed, and then wound up around a wind-up roll. The roll-to-roll system is capable of performing the processing of a continuous length substrate on the km order in one lot and is therefore capable of easily performing mass production. When a comparison is made between the roll-to-roll system and a sheet feeding system wherein separate sheets of the base material are conveyed at each stage, with the sheet feeding system, it is necessary for a base material feeding section and a base material discharging section to be located at each stage, and therefore the apparatus scale at each stage is apt to become large. In contrast, with the roll-to-roll system, since the base material flows intermittently or successively among the stages, the stages can be connected with one another, and it becomes possible to reduce the work accompanying the conveyance of the base material and to reduce the size of the apparatus.

Figure 5:
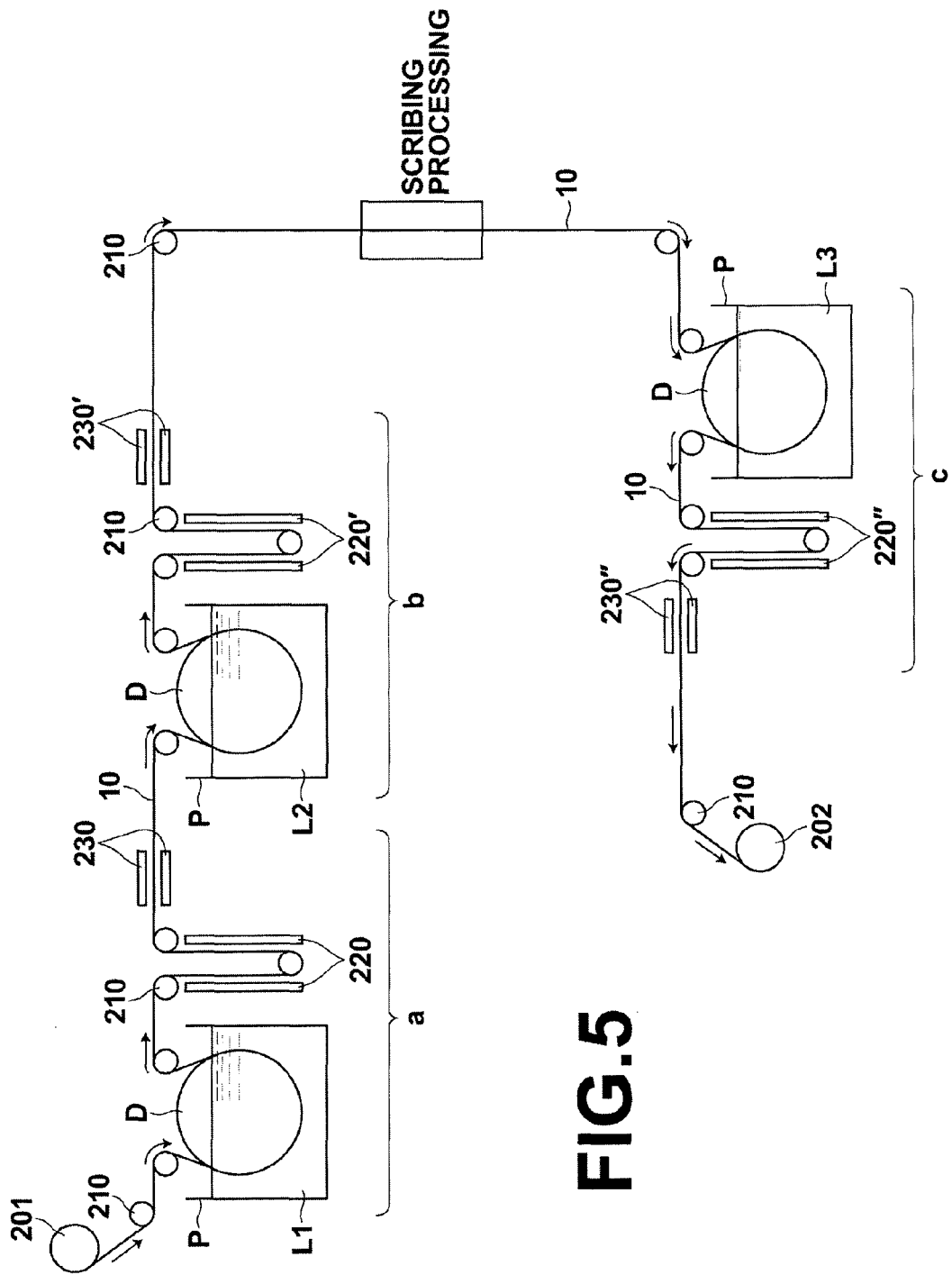
FIG. 5 is a schematic sectional view showing the process for producing a photoelectric conversion device in accordance with the present invention, in which a first aspect of a roll-to-roll system is employed.

FIG. 5 is a schematic sectional view showing the process for producing a photoelectric conversion device 1 in accordance with the present invention, in which a first aspect of a roll-to-roll system is employed. FIG. 6 is a schematic sectional view showing the process for producing a photoelectric conversion device 1 in accordance with the present invention, in which a second aspect of a roll-to-roll system is employed. In the first aspect of the roll-to-roll system as illustrated in FIG. 5, the film forming stages ranging from the stage of forming the buffer layer 20 to the stage of forming the transparent conductive layer 40 are performed in the in-line mode. In the second aspect of the roll-to-roll system as illustrated in FIG. 6, each of the stage of forming the buffer layer 20, the stage of forming the window layer 30, and the stage of forming the transparent conductive layer 40 is performed with the roll-to-roll system, and the section between adjacent stages is performed in the off-line mode. As described above, with the process for producing a photoelectric conversion device in accordance with the present invention, all film forming stages ranging from the stage of forming the buffer layer 20 to the stage of forming the transparent conductive layer 40 are performed with the liquid phase technique. Therefore, it is possible to perform the production with each of the first and second aspects of the roll-to-roll system.

With reference to FIG. 5, the substrate 110 (as illustrated in FIG. 1A) is a flexible substrate, and the continuous length layered substrate 10 (as illustrated in FIG. 1D) comprising the bottom electrode layer 120 and the photoelectric conversion semiconductor layer 130, which are stacked on the substrate 110, is wound around a delivery roll 201. The layered substrate 10 having been delivered from the delivery roll 201 is guided by guide rolls 210, 210 and conveyed into each of zones for the film forming stages. In each film forming zone, a plurality of guide rolls 210, 210, . . . are located at positions requiring adjustment of the direction of conveyance of the continuous length layered substrate 10.

With the process for producing a photoelectric conversion device 1 in accordance with the present invention, in order for all film forming stages ranging from the stage of forming the buffer layer 20 to the stage of forming the transparent conductive layer 40 to be performed with the liquid phase technique, each film forming zone is provided with a reaction chamber P, which contains a reaction mixture (L1, L2, or L3) used for the formation of each layer, and a drum D for dipping a processing region of the continuous length layered substrate 10 into the reaction mixture. Also, in each film forming zone, a washing shower (220, 220', or 220") and a dryer (230, 230', or 230") are located on the side downstream from each reaction chamber P in order to perform the washing and the drying of the continuous length layered substrate 10 after each film forming stage.

Firstly, the layered substrate 10 is fed into a buffer layer forming zone a, and the buffer layer 20 is formed on the photoelectric conversion semiconductor layer 130 of the layered substrate 10 with the buffer layer forming technique in the embodiment described above. The layered substrate 10, on which the buffer layer 20 has been formed, is conveyed to the washing shower 220, and the surface of the buffer layer 20 is washed with water by the washing shower 220. The layered substrate 10 is then dried by the dryer 230 and fed into a window layer forming zone b.

In the window layer forming zone b, the window layer 30 is formed on the buffer layer 20 with the liquid phase technique, such as the CBD technique. In the window layer forming zone b, as in the buffer layer forming zone a, the layered substrate 10, on which the window layer 30 has been formed, is subjected to the washing processing and the drying processing. The layered substrate 10 is then subjected to patterning with scribing processing and is thereafter conveyed into a transparent conductive layer forming zone c.

In this embodiment, wherein the constitution provided with the window layer 30 is employed, the layered substrate 10 is conveyed via the window layer forming zone b into the transparent conductive layer forming zone c. In cases where the constitution which is not provided with the window layer 30 is employed, the layered substrate 10 is conveyed directly from the buffer layer forming zone a into the transparent conductive layer forming zone c.

In the transparent conductive layer forming zone c, the transparent conductive layer 40 constituted of the electrically conductive zinc oxide layer is formed on the layered substrate 10, on which the buffer layer 20 and the window layer 30 have been formed, by use of the technique employed in the embodiment described above. The layered substrate 10 is then subjected to the washing processing and the drying processing and is thereafter wound up around a wind-up roll 202.

The stage, such as the patterning stage (scribing processing) prior to the formation of the transparent conductive layer 40, other than the aforesaid film forming stages intervenes between when the layered substrate 10 is delivered from the delivery roll 201 and when the layered substrate 10 is wound up around the wind-up roll 202. In the first aspect of the roll-to-roll system as illustrated in FIG. 5, wherein the film forming stages ranging from the stage of forming the buffer layer 20 to the stage of forming the transparent conductive layer 40 are performed in the in-line mode, the stage other than the aforesaid film forming stages may often be performed in the in-line mode. The explanation of the system, in which the stage other than the aforesaid film forming stages is performed in the in-line mode, is herein omitted (the illustration of the system is also herein omitted). Also, in cases where it is possible for the stage prior to the film formation of the buffer layer 20 and the stage after the film formation of the transparent conductive layer 40 to be performed in the in-line mode, the system may include the stages described above.

In the second aspect of the roll-to-roll system as illustrated in FIG. 6, the buffer layer forming zone a is provided with the delivery roll 201 and the wind-up roll 202. Also, the window layer forming zone b is provided with a delivery roll 201' and a wind-up roll 202'. Further, the transparent conductive layer forming zone c is provided with a delivery roll 201" and a wind-up roll 202". Each wind-up roll is often used directly as the delivery roll in the next stage.

In the aforesaid first aspect of the roll-to-roll system as illustrated in FIG. 5, wherein all film forming stages ranging from the stage of forming the buffer layer 20 to the stage of forming the transparent conductive layer 40 are performed in the in-line mode with the roll-to-roll system, it becomes possible to perform low-cost easy production. Also, in the second aspect of the roll-to-roll system as illustrated in FIG. 6, wherein the flexible continuous length layered substrate, on which each film has been formed at each of the film forming stages, is obtained in the state in which the layered substrate has been wound around the wind-up roll, the wound-up substrate is capable of being utilized directly as the delivery roll at the next stage for the production with the roll-to-roll system.

[Design Modification]

The process for producing a photoelectric conversion device in accordance with the present invention is not limited to the embodiments described above and may be embodied in various other ways.

For example, the transparent conductive layer 40 may be formed with a film forming technique, which is different from the film forming technique employed in the embodiments described above, and with which the film formation is capable of being performed by use of the liquid phase technique with the layer constitution that does not affect the band gap and does not cause the device characteristics to become bad.

EXAMPLES

The present invention will further be illustrated by the following non-limitative examples.

Examples 1 to 4, Comparative Examples 1 to 3

In Examples 1 to 4 and Comparative Examples 1 to 3, photoelectric conversion devices were prepared by combining the layered substrates and the film forming techniques for the respective layers as described below. Table 1 shows the layer constitution, the combination of the film forming techniques for the respective layers, and the evaluation results in each of Examples 1 to 4 and Comparative Examples 1 to 3.
<Layered Substrates>

As the layered substrates, a layered substrate 1 and a layered substrate 2 described below were prepared.

Layered substrate 1: The layered substrate 1 comprised a soda-lime glass (SLG) substrate provided with an Mo electrode layer, and a CIGS layer formed on the Mo electrode layer of the soda-lime glass (SLG) substrate. The layered substrate 1 was prepared in the manner described below.

The Mo bottom electrode layer having a thickness of 0.8 μm was formed with the sputtering technique on the soda-lime glass (SLG) substrate. A mask was then located on the Mo bottom electrode layer having been formed on the substrate, such that a part of the Mo bottom electrode layer might be exposed. Thereafter, a Cu $(In_{0.7}Ga_{0.3})$ $Se_2$ layer having a film thickness of 1.8 μm was formed on the exposed part of the Mo bottom electrode layer by use of a three-stage technique known as one of the film forming techniques for the CIGS layer.

Layered substrate 2: The layered substrate 2 comprised an anodized substrate, which was constituted of a stainless steel (SUS)-Al composite base material and an anodic aluminum oxide film (AAO) formed on the Al surface of the stainless steel (SUS)-Al composite base material. The layered substrate 2 also comprised a soda-lime glass (SLG) layer, an Mo electrode layer, and a CIGS layer, which were formed in this order on the AAO surface of the anodized substrate. Film thicknesses of the respective layers were as follows: SUS (larger than 300 μm), Al (300 μm), AAO (20 μm), SLG (0.2 μm), Mo (0.8 μm), CIGS (1.8 μm). As in the cases of the layered substrate 1, the layered substrate 2 was prepared in the manner described below.

The Mo bottom electrode layer having a thickness of 0.8 μm was formed with the sputtering technique on the SLG layer. Thereafter, a Cu $(In_{0.7}Ga_{0.3})$ $Se_2$ layer having a film thickness of 1.8 μm was formed as the photoelectric conversion semiconductor layer on the Mo bottom electrode layer by use of the three-stage technique.
<Surface Treatment>

A reaction chamber containing an aqueous 10% KCN solution (adjusted at the room temperature) was prepared. The surface of the CIGS layer of the layered substrate was dipped in the aqueous 10% KCN solution for three minutes, and impurities were thus removed from the surface of the CIGS layer. After the layered substrate was taken out from the aqueous 10% KCN solution, the surface of the CIGS layer was washed with a water washing shower and was then dried with a dryer.
<Formation of CdS Buffer Layer (CBD Technique)>

An aqueous $CdSO_4$ solution, an aqueous thiourea solution, and an aqueous ammonia solution were mixed together in predetermined quantities, and a reaction mixture 1 ($CdSO_4$: 0.0015M, thiourea: 0.05M, ammonia: 1.5M) was thus prepared. The unit M as used herein represents the molar concentration (mol/L). The layered substrate, on which the photoelectric conversion semiconductor layer (CIGS layer) had been formed, was dipped in a reaction chamber containing the reaction mixture 1 at a temperature of 80° C. for six minutes, and a CdS buffer layer was thus deposited. After the layered substrate, on which the CdS buffer layer had been deposited, had been taken out from the reaction chamber, the surface of the deposited CdS buffer layer was washed with a water washing shower and was then dried with a dryer. In this manner, a CdS buffer layer with a thickness of 35 nm was formed on the photoelectric conversion semiconductor layer (CIGS layer).
<Formation of CdS Buffer Layer (Coating Technique)>

A CdS particle dispersion was prepared and applied onto the photoelectric conversion semiconductor layer (CIGS layer) of the layered substrate with a spin coating technique (number of revolution: 3,000 rpm, rotation time: 30 seconds). The resulting coating layer was dried at the room temperature, and a CdS buffer layer having a film thickness of 105 nm was thus formed on the photoelectric conversion semiconductor layer (CIGS layer).
<Formation of Zn (S, O) Buffer Layer (CBD Technique)>

An aqueous $ZnSO_4$ solution, an aqueous thiourea solution, an aqueous sodium citrate solution, and an aqueous ammonia solution were mixed together in predetermined quantities, and a reaction mixture 2 ($ZnSO_4$: 0.03M, thiourea: 0.05M, sodium citrate: 0.03M, ammonia: 0.15M) was thus prepared. The layered substrate, on which the photoelectric conversion semiconductor layer (CIGS layer) had been formed, was dipped for 60 minutes in a reaction chamber containing the reaction mixture 2 at a temperature of 90° C., and a Zn type buffer layer was thus deposited on the photoelectric conversion semiconductor layer (CIGS layer). The thus deposited Zn type buffer layer was then subjected to annealing processing at a temperature of 200° C. for 60 minutes, and a Zn(S, O) buffer layer having a film thickness of 23 nm was thus formed on the photoelectric conversion semiconductor layer (CIGS layer).
<Formation of Zn(S,O) Buffer Layer (Coating Technique)>

A Zn (S, O) particle dispersion was prepared and applied onto the photoelectric conversion semiconductor layer (CIGS layer) of the layered substrate with the spin coating technique (number of revolution: 3,000 rpm, rotation time: 30 seconds). The resulting coating layer was dried at the room temperature, and a Zn (S, O) buffer layer having a film thickness of 0.31 μm was thus formed on the photoelectric conversion semiconductor layer (CIGS layer).
<Formation of Window Layer>

Firstly, $ZnSO_4.7H_2O$ acting as a metal oxide source was dissolved in water with stirring for one hour, such that the molar concentration of $[Zn^{2+}]$ might be 0.02M. Thereafter, $NH_4Cl$ acting as a complexing agent was dissolved in the resulting aqueous solution of $ZnSO_4.7H_2O$ with stirring for 30 minutes, such that $R=[NH_4^+]/[Zn^{2+}]=20$. In this manner, a mother liquor in which the molar concentration of $[Zn^{2+}]$ was 0.02M was prepared.

Thereafter, water and an aqueous NaOH solution were added to the thus obtained mother liquor, such that the molar concentration of $[Zn^{2+}]$ might become equal to 0.02M, and pH=9.5. Also, maleic acid was added in a concentration 1.5 times as high as the molar concentration of $Zn^{2+}$, and a ZnO crystal growing solution was thus prepared. The concentration of maleic acid was expressed in terms of a concentration ratio $R_a$ with respect to $Zn^{2+}$ ($R^a$ [additive]/$[Zn^{2+}]$ in this case, $R_a$=1.5). The layered substrate, on which the buffer layer had been formed, was introduced into the thus prepared ZnO crystal growing solution, and a ZnO crystal was grown at a temperature of 85° C. for one hour.

<Liquid Phase Formation of Transparent Conductive Layer>

A volume of an aqueous 0.10M Zn $(NO_3)_2$ solution and an identical volume of an aqueous 0.10M DMAB solution were mixed together, and the resulting mixture was stirred for a period of time of at least 15 minutes. In this manner, a reaction mixture X (pH: approximately 5.8) to be used for the electrodeposition technique was prepared.

A reference electrode was dipped in a saturated KCl solution, and connection to the reaction mixture X adjusted at a temperature of 60° C. was made with a salt bridge. In this state, energizing processing at 4 coulomb per 1 $cm^2$ was performed for 15 minutes. Thereafter, the layered substrate, on which a thin film layer had been formed with the energizing processing, was taken out from the reaction mixture and was dried at the room temperature. In this manner, an electrically conductive zinc oxide thin film layer was formed (with the electrodeposition technique). In the electrodeposition technique, in the cases of the layered substrate 1, the Mo bottom electrode layer was utilized as the working electrode. In the cases of the layered substrate 2, the SUS surface of the anodized substrate was utilized as the working electrode. Also, a zinc plate was utilized as a counter electrode. Further, a silver/silver chloride electrode was utilized as the reference electrode.

<Vapor Phase Formation of Transparent Conductive Layer>

An Al-doped electrically conductive zinc oxide thin film having a film thickness of 500 nm was formed on the film formation plane for the transparent conductive layer by use of the sputtering technique.

<Evaluation Method>

Finally, a take-out electrode (top electrode) constituted of Al was formed on the transparent conductive layer, and a single solar cell was thus prepared. An energy conversion efficiency of the single solar cell was measured by use of a solar simulator under the conditions using pseudosunlight at Air Mass (AM)=1.5 and 100 $mW/cm^2$. In Table 1, the "o" mark indicates that the energy conversion efficiency was equal to at least 1%, and the "x" mark indicates that the energy conversion efficiency was lower than 1%.

TABLE 1

|  | Example 1 | Example 2 | Example 3 | Example 4 | Example 5 |
|---|---|---|---|---|---|
| Layered substrate | Layered substrate 1 | Layered substrate 1 | Layered substrate 1 | Layered substrate 2 | Layered substrate 2 |
| Surface treatment | Performed | Performed | Performed | Performed | Performed |
| Time from completion of surface treatment to formation of buffer layer | 10 seconds | 10 minutes | 10 seconds | 10 seconds | 10 minutes |
| Buffer layer | CdS | CdS | Zn(S,O) | Zn(S,O) | CdS |
| Technique for forming buffer layer | CBD technique | CBD technique | CBD technique | CBD technique | CBD technique |
| Window layer | Provided | Provided | Not provided | Not provided | Provided |
| Technique for forming window layer | Coating technique | CBD technique | — | — | CBD technique |
| Transparent conductive layer | (ZnO: B) | (ZnO: B) | (ZnO: B) | (ZnO: B) | (ZnO: B) |
| Technique for forming transparent conductive layer | Liquid phase technique | Liquid phase technique | Liquid phase technique | Liquid phase technique | Liquid phase technique |
| Evaluation result | o | o | o | o | o |

|  | Comparative Example 1 | Comparative Example 2 | Comparative Example 3 |
|---|---|---|---|
| Layered substrate | Layered substrate 1 | Layered substrate 1 | Layered substrate 1 |
| Surface treatment | Not performed | Performed | Performed |
| Time from completion of surface treatment to formation of buffer layer | — | 60 minutes | 24 hours |
| Buffer layer | CdS | CdS | Zn(S,O) |
| Technique for forming buffer layer | Coating technique | Coating technique | Coating technique |
| Window layer | Provided | Provided | Not provided |
| Technique for forming window layer | CBD technique | CBD technique | — |
| Transparent conductive layer | (ZnO: Al) | (ZnO: B) | (ZnO: B) |
| Technique for forming transparent conductive layer | Sputtering technique | Liquid phase technique | Liquid phase technique |
| Evaluation result | x | x | x |

INDUSTRIAL APPLICABILITY

The process for producing a photoelectric conversion device in accordance with the present invention is appropriately applicable to use applications of, for example, photoelectric conversion devices for use in solar cells, infrared sensors, and the like.

What is claimed is:

1. A process for producing a photoelectric conversion device having a bottom electrode layer, a photoelectric conversion semiconductor layer, a buffer layer, and a transparent conductive layer, which are stacked in this order on an electrically insulating substrate, wherein the photoelectric conversion semiconductor layer is formed on the bottom electrode layer such that a part of the bottom electrode layer is exposed, and a terminal is located at the exposed part of the bottom electrode layer, wherein all film forming stages ranging from a stage of forming the buffer layer to a stage of forming the transparent conductive layer are performed with a liquid phase technique, the buffer layer is formed with a chemical bath deposition technique, whereby the transparent conductive layer is formed with the electrolytic deposition technique by utilizing the bottom electrode layer as a cathode, and the transparent conductive layer is formed with an electrolytic deposition technique.

2. A process as defined in claim 1 wherein the substrate is constituted of a substrate that is provided with an electrical insulator layer on a front surface side on which the bottom electrode layer is to be formed and that is provided with a metal layer on a rear surface side, the bottom electrode layer is stacked on the front surface side of the substrate, and the transparent conductive layer is formed with the electrolytic deposition technique by utilizing the metal layer as a cathode.

3. A process as defined in claim 2 wherein the substrate is an anodized substrate selected from the group consisting of:

an anodized substrate comprising: (a) an Al base material containing Al as a principal ingredient, and (b) an anodic oxide film containing $Al_2O_3$ as a principal ingredient, the anodic oxide film being formed on one surface side of the Al base material, an anodized substrate comprising: (a) a composite base material which is constituted of an Fe material containing Fe as a principal ingredient, and an Al material containing Al as a principal ingredient, the Al material being composited on one surface side of the Fe material, and (b) an anodic oxide film containing $Al_2O_3$ as a principal ingredient, the anodic oxide film being formed on at least one surface side of the composite base material, and an anodized substrate comprising: (a) a base material which is constituted of an Fe material containing Fe as a principal ingredient, and an Al film containing Al as a principal ingredient, the Al film being formed on at least one surface side of the Fe material, and (b) an anodic oxide film containing $Al_2O_3$ as a principal ingredient, the anodic oxide film being formed on one surface side of the base material.

4. A process as defined in claim 1 wherein the bottom electrode layer contains Mo as a principal ingredient.

5. A process as defined in claim 1 wherein the transparent conductive layer contains boron-doped zinc oxide as a principal ingredient.

6. A process as defined in claim 1 wherein the buffer layer is constituted of a Zn compound layer containing Zn (S, O) and/or Zn (S,O, OH) as a principal ingredient, the Zn compound layer is formed with the chemical bath deposition technique by use of a reaction mixture at a reaction temperature selected within the range of 70° C. to 95° C., the reaction mixture containing: an ingredient (Z) that comprises at least one zinc source, an ingredient (S) that comprises at least one sulfur source, an ingredient (C) that comprises at least one citrate compound, an ingredient (N) that comprises at least one of the members selected from the group consisting of ammonia and ammonium salts, and water, the concentration of the ingredient (C) in the reaction mixture being selected within the range of 0.001 to 0.25M, the concentration of the ingredient (N) in the reaction mixture being selected within the range of 0.001 to 0.40M, pH of the reaction mixture prior to beginning of the reaction being selected within the range of 9.0 to 12.0, and the thus formed Zn compound layer is subjected to annealing processing at a temperature selected within the range of 150° C. to 220° C. for a period of time selected within the range of 5 to 90 minutes.

7. A process as defined in claim 1 wherein a stage of forming a window layer on the buffer layer with a coating technique and/or the chemical bath deposition technique is performed between the stage of forming the buffer layer and the stage of forming the transparent conductive layer, and the stage of forming the transparent conductive layer is performed on the buffer layer such that the window layer intervenes between the buffer layer and the transparent conductive layer.

8. A process as defined in claim 1 wherein the surface of the photoelectric conversion semiconductor layer, on which surface the buffer layer is to be formed, is subjected to surface treatment by being dipped in a reaction liquid adapted for removing impurities from the surface, and the buffer layer is formed on the photoelectric conversion semiconductor layer, which has been subjected to the surface treatment.

9. A process as defined in claim 8 wherein the buffer layer is formed within 60 minutes after the surface treatment has been performed.

10. A process as defined in claim 9 wherein the buffer layer is formed within 10 minutes after the surface treatment has been performed.

11. A process as defined in claim 1 wherein the transparent conductive layer is formed with the electrolytic deposition technique by use of a reaction mixture containing zinc ions, nitrate ions, and at least one borane type compound.

12. A process as defined in claim 11 wherein the borane type compound is dimethylamine borane.

13. A process as defined in claim 1 wherein a principal ingredient of the photoelectric conversion semiconductor layer is at least one compound semiconductor having a chalcopyrite structure.

14. A process as defined in claim 13 wherein the principal ingredient of the photoelectric conversion semiconductor layer is at least one compound semiconductor comprising:

at least one Group-Ib element selected from the group consisting of Cu and Ag, at least One Group-IIIb element selected from the group consisting of Al, Ga, and In, and at least one Group-VIb element selected from the group consisting of S, Se, and Te.

15. A process as defined in claim 1 wherein the substrate is a flexible substrate, and all film forming stages ranging from the stage of forming the buffer layer to the stage of forming the transparent conductive layer are performed with a roll-to-roll system.

16. A process as defined in claim 15 wherein the film forming stages ranging from the stage of forming the buffer layer to the stage of forming the transparent conductive layer are performed in an in-line mode.

17. A process as defined in claim 15 wherein each of all film forming stages ranging from the stage of forming the buffer layer to the stage of forming the transparent conductive layer is performed with the roll-to-roll system, and the section between adjacent stages among all film forming stages is performed in an off-line mode.

\* \* \* \* \*